(12) United States Patent
Lajoie et al.

(10) Patent No.: US 12,513,970 B2
(45) Date of Patent: Dec. 30, 2025

(54) INTEGRATED CIRCUITS WITH TUNGSTEN INTERCONNECT LINERS

(71) Applicant: Intel Corporation, Santa Clara, CA (US)

(72) Inventors: Travis W. Lajoie, Forest Grove, OR (US); Pei-hua Wang, Beaverton, OR (US); Gregory J. George, Beaverton, OR (US); Bernhard Sell, Portland, OR (US); Juan G. Alzate-Vinasco, Tigard, OR (US); Chieh-Jen Ku, Portland, OR (US); Alekhya Nimmagadda, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 949 days.

(21) Appl. No.: 17/485,331

(22) Filed: Sep. 25, 2021

(65) Prior Publication Data

US 2023/0097793 A1    Mar. 30, 2023

(51) Int. Cl.
*H10D 64/62* (2025.01)
*H01L 21/02* (2006.01)
(Continued)

(52) U.S. Cl.
CPC ....... *H10D 64/62* (2025.01); *H01L 21/02565* (2013.01); *H01L 21/02592* (2013.01);
(Continued)

(58) Field of Classification Search
CPC ......... H01L 21/02565; H01L 21/02592; H01L 21/443; H01L 21/76846; H01L 23/5226;
(Continued)

(56) References Cited

U.S. PATENT DOCUMENTS 5,942,799 A * 8/1999 Danek ............... H01L 23/53238
257/762
6,258,707 B1 * 7/2001 Uzoh ................. H01L 21/76877
257/E21.585
(Continued)

FOREIGN PATENT DOCUMENTS

DE   202008008583 U1 * 8/2008 ....... H01L 23/53238
EP      4009376 A1    6/2022

OTHER PUBLICATIONS

Chang, Kow-Ming, et al., "Amorphouslike chemical vapor deposited tungsten diffusion barrier for copper metallization and effects of nitrogen addition", Journal of Applied Physics, vol. 82 (3), pp. 1469-1475 (Year: 1997).*

(Continued)

*Primary Examiner* — Fernando L Toledo
*Assistant Examiner* — Ryan T. Fortin
(74) *Attorney, Agent, or Firm* — Akona IP PC

(57) ABSTRACT

Described herein are integrated circuit devices with semiconductor devices and interconnects coupled to contacts of the semiconductor devices, where the interconnects have tungsten liners between a fill material of the interconnect and the contacts. Interconnect liners can help maintain conductivity between semiconductor devices (e.g., transistors) and the interconnects that conduct current to and from the semiconductor devices. Tungsten liners may be in combination with semiconductor devices that use certain channel materials, such as indium gallium zinc oxide.

20 Claims, 9 Drawing Sheets

(51) Int. Cl.
*H01L 21/443* (2006.01)
*H10B 12/00* (2023.01)
*H10D 30/67* (2025.01)
*H10D 62/40* (2025.01)
*H10D 62/80* (2025.01)
*H10D 99/00* (2025.01)

(52) U.S. Cl.
CPC .......... *H01L 21/443* (2013.01); *H10B 12/05* (2023.02); *H10B 12/315* (2023.02); *H10D 30/6729* (2025.01); *H10D 30/6756* (2025.01); *H10D 62/402* (2025.01); *H10D 62/80* (2025.01); *H10D 99/00* (2025.01)

(58) Field of Classification Search
CPC ............... H01L 23/5283; H01L 23/535; H01L 23/53266; H01L 23/53238; H01L 27/124; H01L 29/45; H01L 29/247; H01L 29/41733; H01L 29/66969; H01L 29/78693; H01L 29/78681; H01L 29/7869; H10B 12/05; H10B 12/315
See application file for complete search history.

(56) References Cited

U.S. PATENT DOCUMENTS

| | | | | |
|---|---|---|---|---|
| 6,528,884 | B1* | 3/2003 | Lopatin | H01L 21/76838 257/547 |
| 6,607,977 | B1* | 8/2003 | Rozbicki | H01L 21/76805 438/653 |
| 10,347,528 | B1* | 7/2019 | Singh | H01L 21/76816 |
| 2005/0208767 | A1* | 9/2005 | Ding | H01L 23/53238 438/785 |
| 2006/0113675 | A1* | 6/2006 | Chang | H01L 21/76849 257/E21.582 |
| 2011/0221044 | A1* | 9/2011 | Danek | H01L 21/76873 257/E21.597 |
| 2016/0056077 | A1* | 2/2016 | Lai | H01L 21/76876 438/653 |
| 2019/0148225 | A1 | 5/2019 | Chen et al. | |
| 2019/0164896 | A1* | 5/2019 | Koike | H01L 29/7851 |
| 2019/0206893 | A1* | 7/2019 | Liaw | H01L 23/5283 |
| 2019/0259844 | A1 | 8/2019 | Sharma et al. | |
| 2020/0035628 | A1* | 1/2020 | Huang | H01L 27/14621 |
| 2020/0395311 | A1* | 12/2020 | Chen | H01L 21/28556 |
| 2021/0151438 | A1* | 5/2021 | Gomes | G11C 11/4045 |
| 2021/0184008 | A1 | 6/2021 | Cheng et al. | |

OTHER PUBLICATIONS

Tai, Kaori, et al., "New complementary PVD-Ta/CVD-WN stacked barrier structure for copper metallization", Proceedings of the IEEE International Interconnect Technology Conference, 5th, Burlingame, CA, United States, Jun. 3-5, 2002, pp. 194-196 (Year: 2002).*

Kim, Young-Soon, et al., "Direct Copper Electroless Deposition on a Tungsten Barrier Layer for Ultralarge Scale Integration", Journal of The Electrochemical Society 152 (2), pp. C89-C95 (Year: 2005).*

* cited by examiner

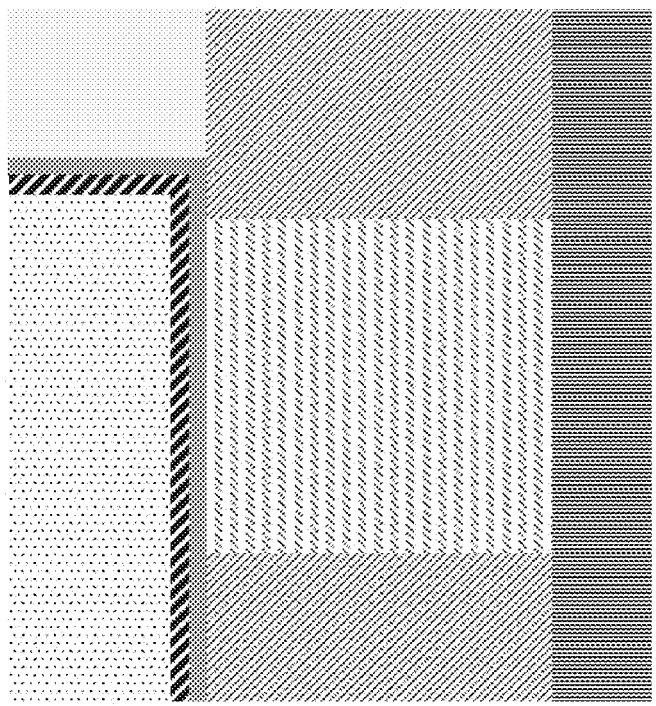
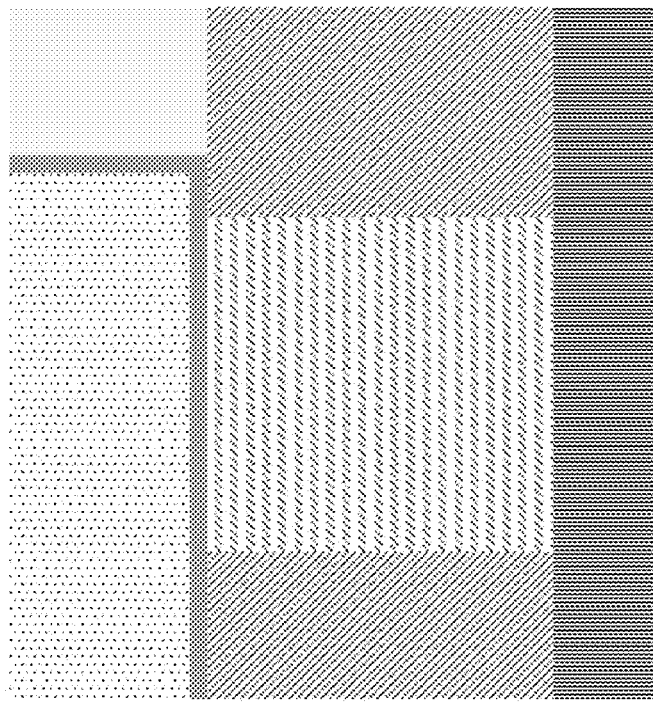
FIG. 4
FIG. 5

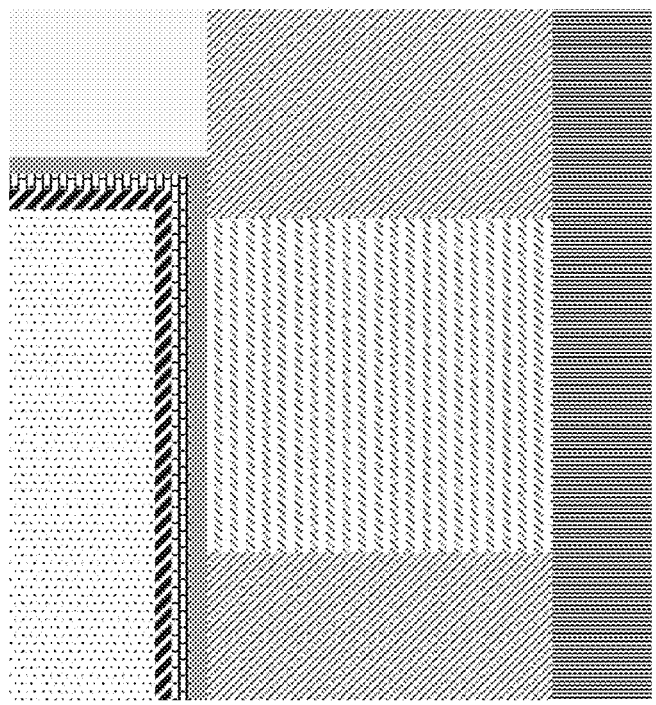
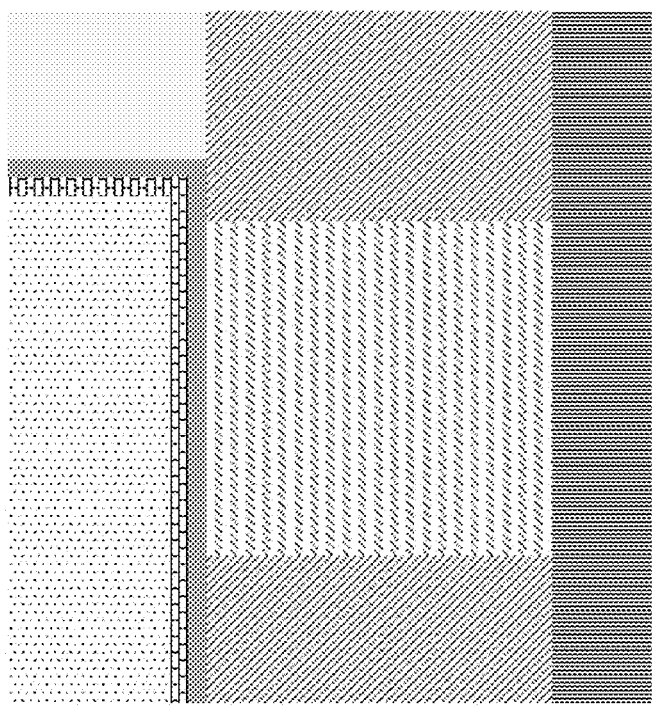
FIG. 7
FIG. 6

INTEGRATED CIRCUITS WITH TUNGSTEN INTERCONNECT LINERS

TECHNICAL FIELD

This disclosure relates generally to the field of integrated circuit (IC) structures and devices, and more specifically, to interconnect materials incorporated in such IC structures and devices.

BACKGROUND

In IC devices, electrically conductive interconnects provide electrically conductive paths between transistors and other circuit elements. For example, a transistor typically has a source contact, a drain contact, and a gate contact, each of which is coupled to a respective portion of interconnect that delivers signal from or to another portion of the IC device. Copper is typically used to form interconnects. However, copper tends to diffuse into surrounding materials, so copper interconnects are typically surrounded by a barrier material, such as titanium or tantalum.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 4 is a zoomed-in cross-sectional view of a source/drain contact region in which the interconnect has a tungsten liner, according to some embodiments of the present disclosure.

FIG. 5 is a zoomed-in cross-sectional view of a source/drain contact region in which the interconnect has a tungsten liner layer and a tantalum liner layer, according to some embodiments of the present disclosure.

FIG. 6 is a zoomed-in cross-sectional view of a source/drain contact region in which the interconnect has a tungsten liner layer and a tantalum nitride liner layer, according to some embodiments of the present disclosure.

FIG. 7 is a zoomed-in cross-sectional view of a source/drain contact region in which the interconnect has a tungsten liner layer, a tantalum liner layer, and a tantalum nitride liner layer, according to some embodiments of the present disclosure.

DETAILED DESCRIPTION

Overview

Figure 1:
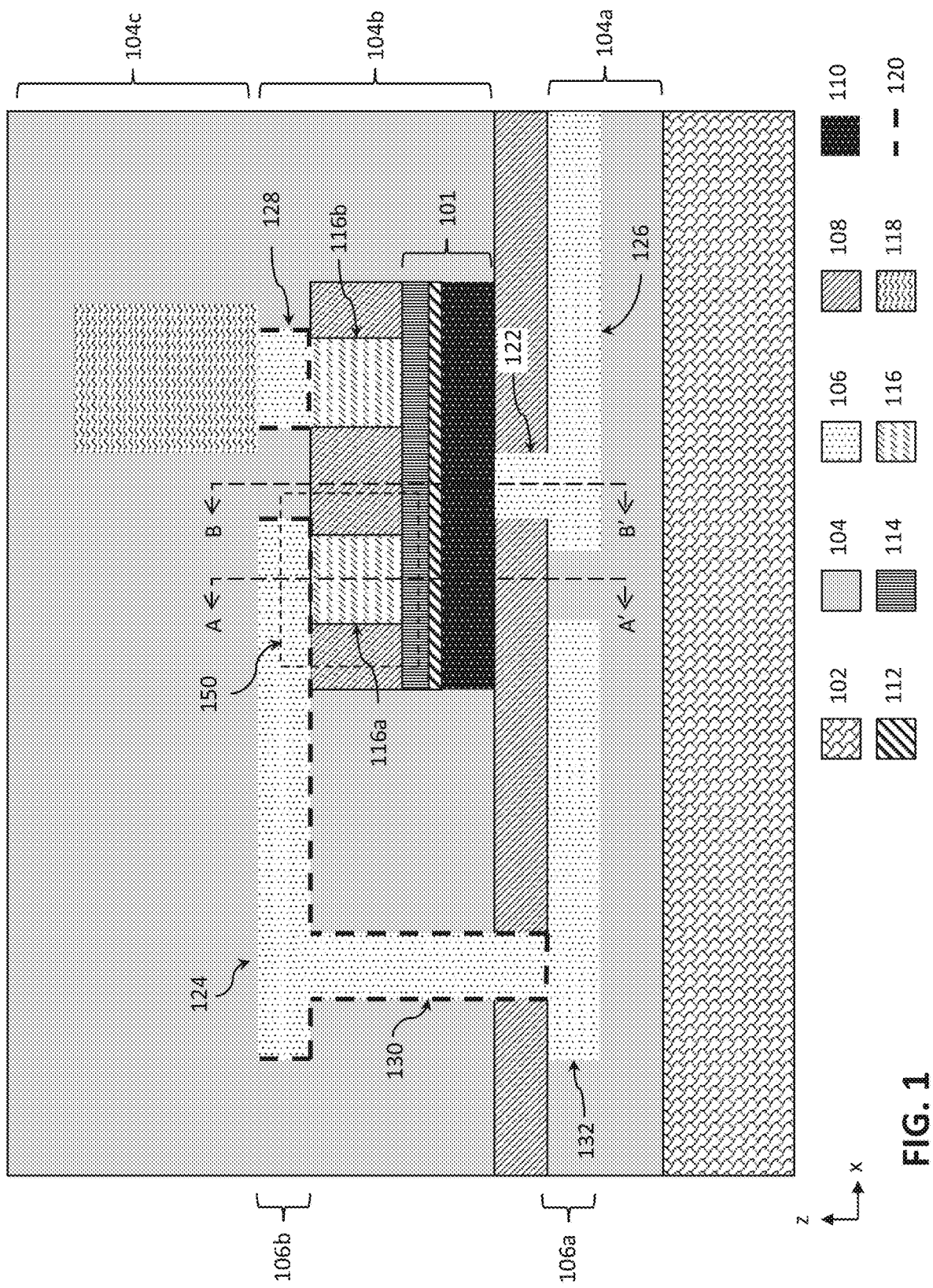
FIG. 1 is a cross-sectional view showing an example arrangement of a one transistor one capacitor (1T-1C) memory cell with lined interconnects coupled to the memory cell, according to some embodiments of the present disclosure.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

Described herein are IC devices that include interconnects lined with one or more barrier materials, and methods for producing such devices. An IC device includes various circuit elements, such as transistors and capacitors, coupled together by metal interconnects. One example IC device includes memory cells for storing bits of data. A memory cell may include a capacitor for storing a bit value or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source or drain (S/D) region/terminal of the access transistor (e.g., to the source region of the access transistor), while the other S/D region of the access transistor may be coupled to a bitline (BL), and a gate terminal of the transistor may be coupled to a word-line (WL). Various 1T-1C memory cells have, conventionally, been implemented with access transistors being front end of line (FEOL), logic-process based, transistors implemented in an upper-most layer of a semiconductor substrate.

The BL and WL are each formed from metal interconnects that are coupled to additional memory cells, and in particular, access transistors of other memory cells. For example, a BL runs along a column of memory cells, and the BL is coupled to one S/D terminal of each of the access transistors in the column of memory cells via an S/D contact. A WL runs along a row of memory cells, and the WL is coupled to the gate of each of the access transistors in the row of memory cells via a gate contact.

Transistors, such as the access transistor of the memory cell described above, include a channel material in which two S/D regions are formed. The channel material is typically a semiconductor, such as silicon. Various different semiconductor materials have been used as transistor channel materials, such as germanium, indium antimonide, lead telluride, indium arsenide, indium phosphide, gallium arsenide, indium gallium arsenide, gallium antimonide, or other combinations of group III-V, group II-VI, or group IV materials.

One particular channel material of recent interest is indium gallium zinc oxide (IGZO). IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors.

IGZO can be deposited as a uniform amorphous phase while retaining higher carrier mobility than oxide semiconductors such as zinc oxide. Different formulations of IGZO include different ratios of indium, gallium, zinc, and oxide. One particular form of IGZO has the chemical formula $InGaO_3(ZnO)_5$. In other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

Common barrier materials for metal interconnects include tantalum (Ta) and tantalum nitride (TaN). When these barrier materials are used in interconnects with IGZO-based devices (e.g., a transistor with a IGZO channel material), the barrier material and channel material can interact and degrade performance of the IC device. Similar degradation can occur with other channel materials, such as other combinations of indium, gallium, zinc, and oxygen (e.g., indium gallium oxide, indium oxide, zinc oxide, gallium oxide), and other metal oxides discussed below.

To maintain conductivity within the transistor, and between the transistor contacts and the interconnect, alternate barrier materials are described herein. For example, a transistor with an IGZO channel is coupled to a metal interconnect that is lined with tungsten instead of Ta or TaN. In some embodiments, additional layers of barrier material are included, e.g., a Ta and/or TaN layer inside the tungsten layer (i.e., between the tungsten barrier layer and the copper interconnect). The tungsten layer thus shields the inner barrier layer(s) from the channel material. In other embodiments, other barrier materials may be used, such as titanium, titanium nitride, ruthenium, molybdenum, iridium, and platinum.

The interconnects with barrier material liners described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "logic state" of a ferroelectric memory cell refers to one of a finite number of states that the cell can have, e.g. logic states "1" and "0," each state represented by a different polarization of the ferroelectric material of the cell. In another example, as used herein, a "READ" and "WRITE" memory access or operations refer to, respectively, determining/sensing a logic state of a memory cell and programming/setting a logic state of a memory cell. In other examples, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. In yet another example, a "high-k dielectric" refers to a material having a higher dielectric constant (k) than silicon oxide.

The terms "oxide," "carbide," "nitride," etc. refer to compounds containing, respectively, oxygen, carbon, nitrogen, etc.

Example IC Device with Lined Interconnects

FIG. 1 is a cross-sectional view showing an example arrangement of a one transistor one capacitor (1T-1C) memory cell with lined interconnects coupled to the memory cell, according to some embodiments of the present disclosure.

The 1T-1C memory cell includes a transistor 101 coupled to a pair of S/D contacts 116a and 116b and a gate via 122. The gate via 122 is coupled to a WL 126, and the first S/D contact 116a is coupled to a BL 124. The second S/D contact 116b is coupled to one electrode of a capacitor 118 via a capacitor interconnect 128. The capacitor 118 may have a second electrode coupled to another interconnect, referred to as a plateline (PL), not shown in FIG. 1.

A number of elements referred to in the description of FIGS. 1-7 with reference numerals are illustrated in these figures with different patterns, with a legend showing the correspondence between the reference numerals and patterns being provided at the bottom or side of each drawing page containing FIGS. 1-7. For example, the legend in FIG. 1 illustrates that FIG. 1 uses different patterns to show a support structure 102, an interlayer dielectric (ILD) material 104, an interconnect material 106, an insulator 108, a gate electrode 110, a gate dielectric 112, a channel material 114, source or drain (S/D) contact 116, capacitor 118, and barrier material 120.

In the drawings, some example structures of various devices and assemblies described herein are shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Figure 2:
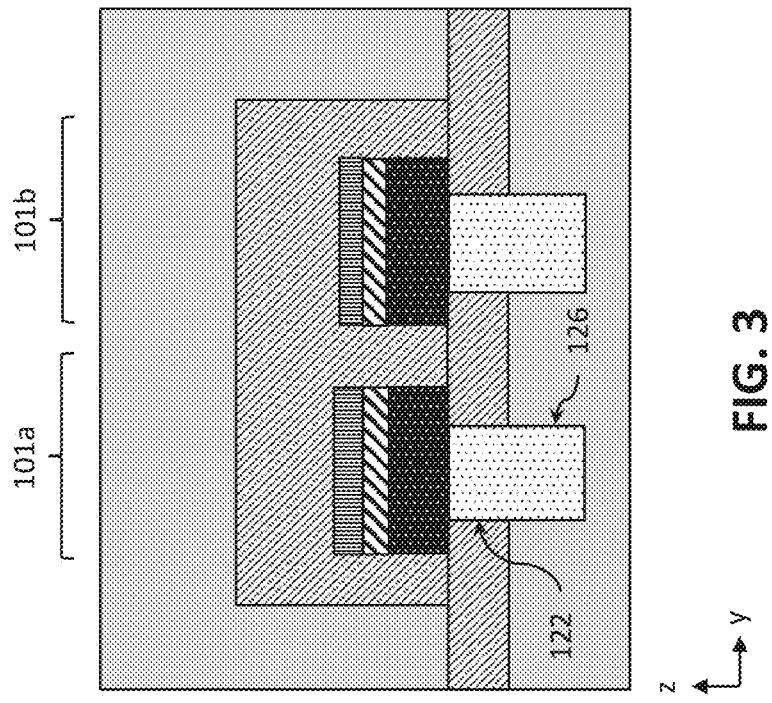
FIG. 2 is cross-sectional view along a plane AA' of the example arrangement shown in FIG. 1, according to some embodiments of the present disclosure.
Figure 3:
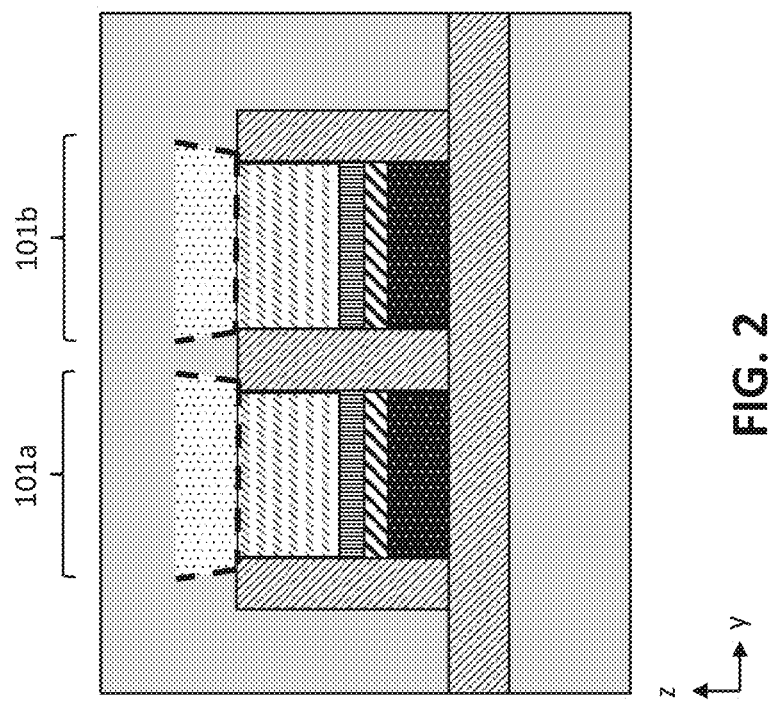
FIG. 3 is cross-sectional view along a plane BB' of the example arrangement shown in FIG. 1, according to some embodiments of the present disclosure.

FIG. 1 illustrates two planes AA' and BB' through portions of the transistor 101 and surrounding interconnects 106. Plane AA' illustrates a plane through the first S/D contact 116a, and plane BB' illustrates a plane through the gate via 122. FIG. 2 is cross-sectional view along the plane AA', and FIG. 3 is cross-sectional view along the plane BB'. FIGS. 2 and 3 each illustrate two neighboring transistors of two neighboring memory cells, e.g., the transistor 101a corresponds to the transistor 101 illustrated in FIG. 1, and an adjacent transistor 101b is located further into the page in the orientation shown in FIG. 1.

In general, implementations of the present disclosure may be formed or carried out on a support structure 102, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure. In various embodiments the support structure 102 may include any such substrate that provides a suitable surface for providing the memory cell shown in FIG. 1.

ILD material 104 is formed over the support structure 102. The ILD material 104 may be any suitable insulator material, such as a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the ILD material 104 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

The ILD material 104 shown in FIG. 1 may be deposited in multiple layers. For example, a first ILD layer 104a is deposited above the support structure 102, and the transistor 101 is formed over the first ILD layer 104a. A second ILD layer 104b is deposited over and around the transistor 101 and over another insulator layer 108, e.g., an etch stop layer. A third ILD layer 104c is deposited over the second ILD layer 104b and around the capacitor 118. While a single ILD material 104 represented by a single pattern is shown in FIG. 1, in other embodiments, different types of ILD materials are used at different portions of the device.

Electrical signals are routed to the memory cell via interconnect 106. The interconnect 106 is formed into various interconnect structures that are typically arranged in multiple layers under and/or over electronic devices. In FIG. 1, a first interconnect layer 106a is disposed over the support structure 102 and under the transistor 101, and a second interconnect layer 106b is disposed over the transistor 101 and under the capacitor 118. Electrically conductive features of the electronic devices (e.g., the gate electrode 110, the S/D contacts 116, and an electrode of the capacitor 118) are electrically coupled with interconnect structures of the interconnect layers 106a and 106b.

The interconnect structures may be arranged within the interconnect layers 106a and 106b and/or other interconnect layers not specifically shown in FIG. 1 to route electrical signals between different electrical devices according to a wide variety of designs. For example, additional interconnect structures may be coupled to additional circuit elements in an IC device, e.g., additional memory cells. For example, the interconnect structure 124 that is coupled to the first S/D contact 116a may be a BL coupled to S/D contacts of additional memory cells along a column, while the interconnect structure 126 coupled to the gate electrode 110 may be a WL coupled to gate electrodes of additional memory cells along a row.

The interconnect 106 is formed into trench structures, also referred to as "lines", and via structures, also referred to as "holes". The trench structures are arranged to route electrical signals in a direction of a plane that is substantially parallel with a surface of the support structure 102, i.e., the x-y plane in the coordinate system shown in FIG. 1. For example, some trench structures route electrical signals in a direction in and out of the page (the y-direction) from the perspective of FIG. 1, and other trench structures route electrical signals in a direction left and right (i.e., in the x-direction) from the perspective of FIG. 1. For example, the interconnect structure 126 that forms the WL is a trench structure extending in the x-direction. A cross-section of the interconnect structure 126 is shown in FIG. 3. The via structures are arranged to route electrical signals in a direction of a plane that is substantially perpendicular to the surface of the support structure 102, i.e., in the z-direction in the coordinate system shown in FIG. 1. For example, the interconnect structure 122, which couples the WL 126 to the gate electrode 110, is a via, also referred to as a gate via. In some embodiments, the via structures may electrically couple trench structures of different interconnect layers together. For example, the trench interconnect structure 124 is coupled to a via 130 that couples the trench interconnect structure 124 in the second interconnect layer 106b to another trench structure 132 in the first interconnect layer 106a.

The interconnect 106 is an electrically conductive material, such as copper. More generally, the interconnect 106 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, interconnect may include one or more electrically conductive alloys, oxides, or carbides of one or more metals. While a single interconnect material represented by a single pattern is shown in FIG. 1, in other embodiments, different interconnect materials are used at different portions of an IC device. For example, the interconnect structure 122 coupling the gate electrode 110 to the WL 126, or the interconnect structure 128 coupling the capacitor 118 to the second S/D contact 116, may be formed of a different conductive material from other portions of the interconnect 106.

At least some portions of the interconnect 106 includes a barrier material 120. The barrier material 120 forms an interconnect liner that lines an interconnect structure. In the example shown in FIG. 1, the barrier material 120 forms a lining of the interconnect structures 124, 130, and 128. In some embodiments, the barrier material 120 is or includes tungsten. In some embodiments, the barrier material 120 is or includes ruthenium. In some embodiments, the barrier material 120 is or includes molybdenum. In some embodiments, the barrier material 120 is or includes iridium. In some embodiments, the barrier material 120 is or includes platinum. In some embodiments, the barrier material 120 is or includes titanium. In some embodiments, the barrier material 120 is or includes titanium nitride.

In some embodiments, multiple layers of different barrier materials 120 are included. For example, an outer layer (farther from the interconnect 106) may be one of tungsten, titanium, titanium nitride, ruthenium, molybdenum, iridium, and platinum, and an inner layer (adjacent to the interconnect 106) is another one of tungsten, titanium, titanium nitride, ruthenium, molybdenum, iridium, and platinum. Alternatively, the inner layer may be a more traditional barrier material, such as tantalum or tantalum nitride. In some embodiments, three or more barrier layers are included, e.g., an outermost tungsten layer, followed by a tantalum layer, followed by a tantalum nitride layer. Example arrangements of multiple barrier layers are shown in FIGS. 5-7.

In this example, after the transistor 101 is formed, portions of the second ILD layer 104b are patterned to form the regions where the interconnect structures 130, 124, and 128 are formed. As used herein, "patterning" may refer to forming a pattern in one or more materials using any suitable techniques (e.g., applying a resist, patterning the resist using lithography, and then etching the one or more material using dry etching, wet etching, or any appropriate technique). The barrier material 120 is deposited in the patterned regions, and the interconnect 106 is deposited over the barrier material 120 to form the interconnect structures 130, 124, and 128.

In the example shown in FIG. 1, a conformal deposition process, such as atomic layer deposition (ALD) or chemical vapor deposition (CVD), is used to deposit the barrier material 120. Conformal deposition generally refers to deposition of a certain coating on any exposed surface of a given structure. A conformal coating may, therefore, be understood as a coating that is applied to exposed surfaces of a given structure, and not, for example, just to the horizontal surfaces. In other embodiments, a non-conformal deposition process, also referred to as a directional deposition process, is used to deposit the barrier material 120. Directional deposition processes include physical vapor deposition (PVD), e.g., sputtering. In such embodiments, the barrier material 120 may not be present on vertical surfaces of the interconnect 106 (e.g., along the side walls of the via 130).

The barrier material 120, or alternative barrier materials, may be formed around other portions of the interconnect 106 than shown in FIG. 1. For example, the barrier material 120 may be deposited along the tops of the interconnect structures 124 and 128. As another example, the barrier material 120 may be formed around the first interconnect layer 106a, e.g., deposited below and/or above the interconnect structure 126. Barrier materials around other portions of the interconnect 106 may be formed from different materials (e.g., tantalum and/or tantalum nitride) than the barrier material 120 shown in FIG. 1.

An insulator 108 is formed over the first interconnect layer 106a and electrically separates the transistor 101 (in particular, the gate electrode 110) from the first interconnect layer 106a. The insulator 108 may include any of the insulating materials described with respect to the ILD 104, e.g., silicon oxide, carbon-doped silicon oxide, silicon carbide, silicon nitride, aluminum oxide, and/or silicon oxynitride. In some embodiments, the insulator 108 is or includes an etch-stop material; the etch-stop material may include, e.g., silicon nitride. As shown in FIG. 1, portions of interconnect 106 (e.g., the via 130) extend through the insulator 108 to form electrical connections between different layer of the interconnect (e.g., between the first interconnect layer 106a and the second interconnect layer 106b).

The transistor 101 is formed over the insulator 108 and includes a gate electrode 110, a gate dielectric 112, and a channel material 114. The gate electrode 110 and the gate dielectric 112 form a gate stack.

The gate electrode 110 may include at least one P-type work function metal or N-type work function metal, depending on whether the transistor 101 is a PMOS transistor or an NMOS transistor (P-type work function metal used as the gate electrode 110 when the transistor 101 is a PMOS transistor and N-type work function metal used as the gate electrode 110 when the transistor 101 is an NMOS transistor). For a PMOS transistor, metals that may be used for the gate electrode 110 may include, but are not limited to, ruthenium, palladium, platinum, cobalt, nickel, and conductive metal oxides (e.g., ruthenium oxide). For an NMOS transistor, metals that may be used for the gate electrode 110 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). Other materials that may be used include titanium nitride, tantalum nitride, hafnium nitride, tungsten, iridium, copper, or degenerately doped poly-silicon. In some embodiments, the gate electrode 110 may consist of a stack of two or more metal layers, where one or more metal layers are work function metal layers and at least one metal layer is a fill metal layer. Further layers may be included next to the gate electrode 110 for other purposes, such as to act as a diffusion barrier layer or/and an adhesion layer.

In some embodiments, the gate dielectric 112 may include one or more high-k dielectrics. Examples of high-k materials that may be used in the gate dielectric 112 may include, but are not limited to, hafnium oxide, hafnium silicon oxide, lanthanum oxide, lanthanum aluminum oxide, zirconium oxide, zirconium silicon oxide, silicon oxide, tungsten oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, lead zinc niobate, aluminum nitride, and silicon nitride. In some embodiments, the gate dielectric 112 may consist of a stack of two or more dielectric layers, e.g., a stack of two or more of the high-k materials listed above. The gate dielectric 112, or a layer of the gate dielectric 112, may comprise a mixture of the materials listed above and/or of other oxides, nitrides, or oxynitrides. The gate dielectric 112 may be deposited using a conformal deposition process, such as ALD or CVD. In some embodiments, an annealing process may be carried out on the gate dielectric 112 during manufacture of the transistor 101 to improve the quality of the gate dielectric 112. The gate dielectric 112 may have a thickness, a dimension measured in the direction of the z-axis of the reference coordinate system x-y-z shown in FIG. 1, that may, in some embodiments, be between 0.5 nanometers and 20 nanometers, including all values and ranges therein (e.g., between 2 and 6 nanometers).

The channel material 114 may be composed of semiconductor material systems including, for example, N-type or P-type materials systems. In some embodiments, the channel material 114 may include a high mobility oxide semiconductor material, such as IGZO, or other combinations of indium, gallium, zinc, and/or oxygen. In some embodiments, the channel material 114 may include a monocrystalline semiconductor, such as silicon (Si) or germanium (Ge). In some embodiments, the channel material 114 may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material 114 may include a compound semiconductor with a first sub-lattice of at least one element from group II of the periodic table (e.g., Zn, Cd, Hg), and a second sub-lattice of at least one element of group IV of the periodic table (e.g., C, Si, Ge, Sn, Pb).

For some example N-type transistor embodiments (i.e., for the embodiments where the transistor 101 is an N-type metal-oxide-semiconductor (NMOS)), the channel material 114 may advantageously include a III-V material having a high electron mobility, such as, but not limited to InGaAs, InP, InSb, and InAs. For some such embodiments, the channel material 114 may be a ternary III-V alloy, such as InGaAs. For some $In_xGa_{1-x}As$ embodiments, In content (x) may be between 0.6 and 0.9, and may advantageously be at least 0.7 (e.g., $In_{0.7}Ga_{0.3}As$). In some embodiments with highest mobility, the channel material 114 may be an intrinsic III-V material, i.e., a III-V semiconductor material not intentionally doped with any electrically active impurity. In alternate embodiments, a nominal impurity dopant level may be present within the channel material 114, for example to further fine-tune a threshold voltage Vt, or to provide HALO pocket implants, etc. Even for impurity-doped embodiments however, impurity dopant level within the channel material 114 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 101 is a P-type metal-oxide-semiconductor (PMOS)), the channel material 114 may advantageously be a group IV material having a high hole mobility, such as, but not limited to Ge or a Ge-rich SiGe alloy. For some example embodiments, the channel material 114 may have a Ge content between 0.6 and 0.9, and advantageously may be at least 0.7. In some embodiments with highest mobility, the channel material 114 may be intrinsic III-V (or IV for P-type devices) material and not intentionally doped with any electrically active impurity. In alternate embodiments, one or more nominal impurity dopant levels may be present within the channel material 114, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the transistor 101 may be a thin film transistor (TFT). A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. If the transistor 101 is a TFT, the channel material 114 may include a high mobility oxide semiconductor material, such as tin oxide, antimony oxide, indium oxide, indium tin oxide, titanium oxide, zinc oxide, indium zinc oxide, IGZO, gallium oxide, titanium oxynitride, ruthenium oxide, aluminum zinc oxide, or tungsten oxide. In general, if the transistor 101 is a TFT, the channel material 114 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, molybdenum disulfide, N- or P-type amorphous or polycrystalline silicon, monocrystalline silicon, germanium, indium arsenide, indium gallium arsenide, indium selenide, indium antimonide, zinc antonomide, antimony selenide, silicon germanium, gallium nitride, aluminum gallium nitride, indium phosphite, black phosphorus, zinc sulfide, indium sulfide, gallium sulfide, each of which may possibly be doped with one or more of gallium, indium, aluminum, fluorine, boron, phosphorus, arsenic, nitrogen, tantalum, tungsten, and magnesium, etc. In some embodiments, the channel material 114 may have a thickness between about 5 and 75 nanometers, including all values and ranges therein. In some embodiments, a thin film channel material 114 may be deposited at relatively low temperatures, which allows depositing the channel material 114 within the thermal budgets imposed on back end fabrication to avoid damaging other components, e.g., front end components such as the logic devices.

While not specifically shown in FIG. 1, S/D regions may be formed in the channel material 114. The S/D regions may generally be formed using either an implantation/diffusion process or an etching/deposition process. In the former process, dopants such as boron, aluminum, antimony, phosphorous, or arsenic may be ion-implanted into the channel material to form the source and drain regions. An annealing process that activates the dopants and causes them to diffuse further into the channel material 114 typically follows the ion implantation process. In the latter process, the channel material 114 may first be etched to form recesses at the locations of the source and drain regions. An epitaxial deposition process may then be carried out to fill the recesses with material that is used to fabricate the source and drain regions. In some implementations, the S/D regions may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions may be formed using one or more alternate semiconductor materials such as germanium or a group III-V material or alloy. And in further embodiments, one or more layers of metal and/or metal alloys may be used to form the S/D regions.

The insulator material 108, or another insulator material, is formed over the transistor 101. The S/D contacts 116 are patterned in the insulator material 108 and coupled to the channel material 114, and in particular, to the S/D regions. The first S/D contact 116a is coupled to a first S/D region, and the second S/D contact 116b is coupled to a second S/D region. The insulator material 108 electrically separates the two S/D contacts 116a and 116b, and electrically separates transistors from one another, as illustrated in FIGS. 2 and 3. In various embodiments, one or more layers of metal and/or metal alloys may be used to form the S/D contacts 116. For example, the electrically conductive materials of the S/D contacts 116 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 116 may include one or more electrically conductive alloys, oxides, or carbides of one or more metals. In some embodiments, the S/D contacts 116 may include a doped semiconductor, such as silicon or another semiconductor doped with an N-type dopant or a P-type dopant. Metals may provide higher conductivity, while doped semiconductors may be easier to pattern during fabrication. Although FIG. 1 illustrates the first and second S/D contacts 116a and 116b with a single pattern, suggesting that the material composition of the first and second S/D contacts is the same, this may not be the case in some other embodiments.

While the transistor 101 depicted in FIG. 1 has a backside gate and front-side S/D contacts, in other embodiments, different transistor architectures may be used, e.g., the gate may be on the front-side, or one or both of the S/D regions and S/D contacts may be on the back-side. In other embodiments, the transistor 101 may have a non-planar architecture, such as a FinFET. In some embodiments, the transistor 101 is a nanoribbon-based transistor (or, simply, a nanoribbon transistor, e.g., a nanowire transistor). In a nanoribbon transistor, a gate stack that may include a stack of one or more gate electrode metals (e.g., the materials discussed with respect to the gate electrode 110) and, optionally, a stack of one or more gate dielectrics (e.g., one of the gate dielectrics 112) may be provided around a portion of an elongated semiconductor structure called "nanoribbon", forming a gate on all sides of the nanoribbon. The portion of the nanoribbon around which the gate stack wraps around is referred to as a "channel" or a "channel portion," and may be formed of any of the channel materials 114 described above. The source region and drain region are provided on the opposite ends of the nanoribbon, on either side of the gate stack, forming, respectively, a source and a drain of such a transistor.

Example Barrier Material Layers

FIG. 4 is a zoomed-in cross-sectional view of a source/drain contact region in which the interconnect has a tungsten liner, according to some embodiments of the present disclosure. FIG. 4 is an example zoomed-in view of the region 150 shown in FIG. 1. The region 150 includes the channel material 114, the insulator 108, the first S/D contact 116a, the interconnect 106, the ILD material 104, and a tungsten barrier layer 402. The interconnect 106 depicted in FIG. 4 is a portion of the interconnect structure 124.

The tungsten barrier layer 402 is an example of the barrier material 120 shown in FIGS. 1 and 2. In this example, the barrier material 120 is a layer of tungsten. In alternate embodiments, the barrier material is titanium, titanium nitride, ruthenium, molybdenum, iridium, or platinum. In further alternate embodiments, a combination of any of these materials and/or tungsten is used. The tungsten barrier layer 402 has a thickness between 0.5 nanometers and 10 nanometers, e.g., the tungsten barrier layer 402 has a thickness in the range of 1 nanometer and 5 nanometers. The tungsten barrier layer 402 is depicted as having the same thickness or a similar thickness in the z-direction and in the x-direction. The tungsten barrier layer 402 may have a similar thickness in the y-direction, along walls in the y-z plane between the interconnect 106 and the ILD 104 (as shown in FIG. 2). In other embodiments, the tungsten barrier layer 402 may be thinner in the x-direction (i.e., along the wall between the interconnect 106 and the ILD 104 depicted in FIG. 4) and the y-direction than in the z-direction, or the tungsten barrier layer 402 may extend only in the x-y direction and not along the sidewalls of the interconnect 106, e.g., if the tungsten barrier layer 402 is deposited using a directional deposition process rather than a conformal deposition process.

As noted above, the interconnect 106 may be a metal interconnect, such as copper. The channel material 114 may be any of the channel materials 114 described with respect to FIG. 1. In one particular embodiment, the channel material 114 includes at least one of oxygen, indium, zinc, or gallium. In some embodiments, the channel material 114 includes oxygen and indium, or oxygen, indium, and zinc. In some embodiments, the channel material 114 includes oxygen, indium, and zinc, and gallium, e.g., the channel material 114 is IGZO.

FIG. 5 is a zoomed-in cross-sectional view of a source/drain contact region in which the interconnect has a tungsten liner layer and a tantalum liner layer, according to some embodiments of the present disclosure. FIG. 5 is another example zoomed-in view of the region 150 shown in FIG. 1, and includes the channel material 114, insulator 108, first S/D contact 116a, interconnect 106, and ILD material 104, shown in FIGS. 1 and 4. FIG. 5 includes two example layers that form the barrier material 120: a tungsten barrier layer 402 and a tantalum barrier layer 502. The tantalum barrier layer 502 is between the tungsten barrier layer 402 and the interconnect 106. The tungsten barrier layer 402 is adjacent to the first S/D contact 116a, and the tantalum barrier layer 502 is adjacent to the interconnect 106. The tungsten barrier layer 402 and tantalum barrier layer 502 may each have a thickness between 0.5 nanometers and 10 nanometers, e.g., in the range of 1 nanometer and 5 nanometers. As noted with respect to FIG. 4, in other embodiments, the barrier layers 402 and/or 502 may be thinner in the x-direction and the y-direction than in the z-direction, or the barrier layers 402 and/or 502 may extend only in the x-y direction and not along the sidewalls of the interconnect 106, e.g., if a directional deposition process is used. In alternate embodiments, instead of the tungsten barrier layer 402, a barrier layer of titanium, titanium nitride, ruthenium, molybdenum, iridium, or platinum, or a combination of any of these materials and/or tungsten, is used.

FIG. 6 is a zoomed-in cross-sectional view of a source/drain contact region in which the interconnect has a tungsten liner layer and a tantalum nitride liner layer, according to some embodiments of the present disclosure. FIG. 6 is another example zoomed-in view of the region 150 shown in FIG. 1, and includes the channel material 114, insulator 108, first S/D contact 116a, interconnect 106, and ILD material 104, shown in FIGS. 1 and 4. FIG. 6 includes two example layers that form the barrier material 120: a tungsten barrier layer 402 and a tantalum nitride barrier layer 602. The tantalum nitride barrier layer 602 is between the tungsten barrier layer 402 and the interconnect 106. The tungsten barrier layer 402 is adjacent to the first S/D contact 116a, and the tantalum nitride barrier layer 602 is adjacent to the interconnect 106. The tungsten barrier layer 402 and tantalum nitride barrier layer 602 may each have a thickness between 0.5 nanometers and 10 nanometers, e.g., in the range of 1 nanometer and 5 nanometers. As noted with respect to FIG. 4, in other embodiments, the barrier layers 402 and/or 602 may be thinner in the x-direction and the y-direction than in the z-direction, or the barrier layers 402 and/or 602 may extend only in the x-y direction and not along the sidewalls of the interconnect 106, e.g., if a directional deposition process is used. In alternate embodiments, instead of the tungsten barrier layer 402, a barrier layer of titanium, titanium nitride, ruthenium, molybdenum, iridium, or platinum, or a combination of any of these materials and/or tungsten, is used.

FIG. 7 is a zoomed-in cross-sectional view of a source/drain contact region in which the interconnect has a tungsten liner layer, a tantalum liner layer, and a tantalum nitride liner layer, according to some embodiments of the present disclosure. FIG. 7 is another example zoomed-in view of the region 150 shown in FIG. 1, and includes the channel material 114, insulator 108, first S/D contact 116a, interconnect 106, and ILD material 104, shown in FIGS. 1 and 4. FIG. 7 includes three example layers that form the barrier material 120: the tungsten barrier layer 402, the tantalum barrier layer 502, and the tantalum nitride barrier layer 602. In this example, the tantalum nitride barrier layer 602 is between the tungsten barrier layer 402 and the tantalum barrier layer 502, the tungsten barrier layer 402 is adjacent to the first S/D contact 116a, and the tantalum barrier layer 502 is adjacent to the interconnect 106. In another embodiment, the tantalum barrier layer 502 and the tantalum nitride barrier layer 602 are switched, so that the tantalum barrier layer 502 is between the tungsten barrier layer 402 and the tantalum nitride barrier layer 602. The tungsten barrier layer 402, the tantalum barrier layer 502, and the tantalum nitride barrier layer 602 may each have a thickness between 0.5 nanometers and 10 nanometers, e.g., in the range of 1 nanometer and 5 nanometers. As noted with respect to FIG. 4, in other embodiments, the barrier layers 402, 502, and/or 602 may be thinner in the x-direction and the y-direction than in the z-direction, or the barrier layers 402, 502, and/or 602 may extend only in the x-y direction and not along the sidewalls of the interconnect 106, e.g., if a directional deposition process is used. In alternate embodiments, instead of the tungsten barrier layer 402, a barrier layer of titanium, titanium nitride, ruthenium, molybdenum, iridium, or platinum, or a combination of any of these materials and/or tungsten, is used.

Example Method for Forming IC Device with Interconnect Liner

Figure 8:
FIG. 8 is a flowchart illustrating a method for forming an IC device with an interconnect liner, according to some embodiments of the present disclosure.

FIG. 8 is a flowchart illustrating a method for forming an IC device with an interconnect liner, according to some embodiments of the present disclosure. The method begins with depositing 802 an insulator material, e.g., the first ILD layer 104a shown in FIG. 1.

The method proceeds with forming 804 a backend interconnect structure, e.g., the interconnect structures 126 and 132 shown in FIG. 1. The backend interconnect may be formed using any known technique, e.g., applying a resist over the ILD 104, patterning the resist using lithography, etching the patterned portions of the ILD 104, and depositing the backend interconnect material, e.g., copper. As shown in FIG. 1, an insulator material 108 (e.g., an etch-stop material) is deposited over the interconnect structures 126 and 132, and a gate via 122 (which may be considered part of the backend interconnect structure) is formed in the insulator material 108 prior to forming the transistor 101. One or more barrier layers, e.g., tantalum and/or tantalum nitride layers, may be deposited prior to depositing the backend interconnect material. If the backend interconnect is in contact with S/D contacts (e.g., one or both of the S/D contacts 116 are on the back-side of the transistor 101 rather than the front-side, as depicted in FIG. 1), a barrier layer comprising tungsten may be deposited over the backend interconnect. An IC device may have more layers of backend interconnect than shown in FIG. 1. Such layers may be formed sequentially, with additional processing steps (e.g., depositing additional layers of ILD) as appropriate. Alternatively, an IC device may have no backend interconnect structure.

The method proceeds with forming 806 a transistor over the backend interconnect structure and the insulator material. For example, the transistor 101 shown in FIG. 1 formed over the first ILD layer 104a and backend interconnect structures 126 and 132, using device processing methods known in the art. The method may include forming many similar transistors and/or other electronic devices in the same layer as the transistor 101.

The method proceeds with depositing 808 S/D contacts over the transistor, e.g., depositing the S/D contacts 116, which are in contact with the channel material 114. The S/D contacts 116 may be formed within a layer of insulator material, e.g., within the insulator material 108 formed over the transistor 101.

The method proceeds with patterning 810 a frontend interconnect structure, e.g., the interconnect structures 128 and 124. The frontend interconnects are patterned in an insulator layer that may be deposited after the S/D contacts 116 are formed, e.g., in the third ILD layer 104*c*. In the example shown in FIG. 1, the via 130 is also patterned after the transistor 101 and S/D contacts 116 are formed, e.g., after the interconnect structures 124 and 128 are patterned. The via 130 is patterned in the second ILD layer 104*b*, which may have been deposited before or after the transistor 101 and/or S/D contacts 116 were formed.

The method proceeds with depositing 812 an interconnect liner material in the regions patterned for the frontend interconnect. For example, any of the barrier materials described with respect to FIGS. 1-7 may be deposited as one or more layers. In the example shown in FIG. 1, the interconnect liner material is deposited along any region that has been patterned in step 810, including within the via 130. In other examples, the interconnect liner material may be found within different portions of the interconnect structure depending on the processing method used. However, the interconnect liner material is found between the S/D contacts 116 and the interconnect coupled to the S/D contacts 116.

The method proceeds with depositing 814 the interconnect material, e.g., copper, over the liner material. In some embodiments, one or more additional liner materials are deposited over the interconnect material, forming an upper barrier for the interconnect. In the example shown in FIG. 1, a capacitor is then formed over the frontend interconnect structure, forming the 1T-1C memory cell. This is just one example IC device that may include a lined interconnect.

Example Devices

The interconnects with barrier material liners disclosed herein may be included in any suitable electronic device. FIGS. 9-12 illustrate various examples of apparatuses that may include the interconnects with barrier material liners disclosed herein.

Figure 9B:
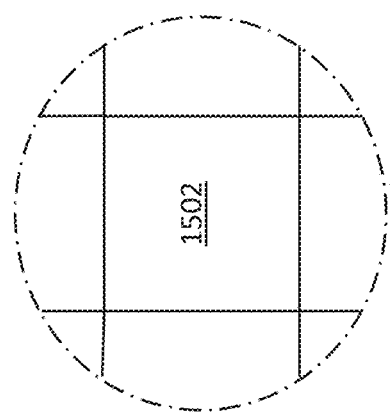
FIGS. 9A and 9B are top views of a wafer and dies that include interconnects with barrier material liners in accordance with any of the embodiments disclosed herein.
Figure 9A:
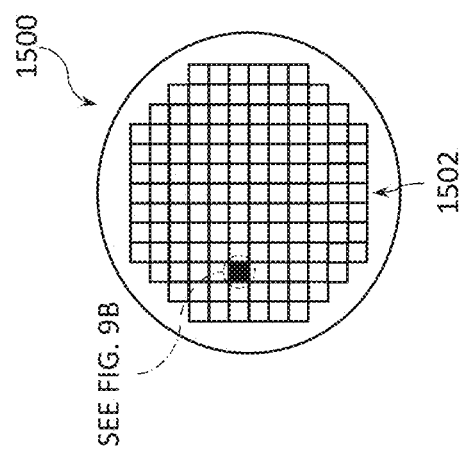

FIGS. 9A and 9B are top views of a wafer and dies that include one or more IC structures with one or more interconnects with barrier material liners in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIGS. 1-7, or any further embodiments of the IC structures described herein). After the fabrication of the semiconductor product is complete (e.g., after manufacture of one or more IC structures with one or more interconnects with barrier material liners as described herein, included in a particular electronic component, e.g., in a transistor or in a memory device), the wafer 1500 may undergo a singulation process in which each of the dies 1502 is separated from one another to provide discrete "chips" of the semiconductor product. In particular, devices that include one or more IC structures with interconnects with barrier material liners as disclosed herein may take the form of the wafer 1500 (e.g., not singulated) or the form of the die 1502 (e.g., singulated). The die 1502 may include one or more transistors (e.g., one or more of the transistors 1640 of FIG. 10, discussed below) and/or supporting circuitry to route electrical signals to the transistors, as well as any other IC components (e.g., one or more IC structures with interconnects with barrier material liners). In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 12) or other logic that is configured to store information in the memory devices or execute instructions stored in the memory array.

Figure 10:
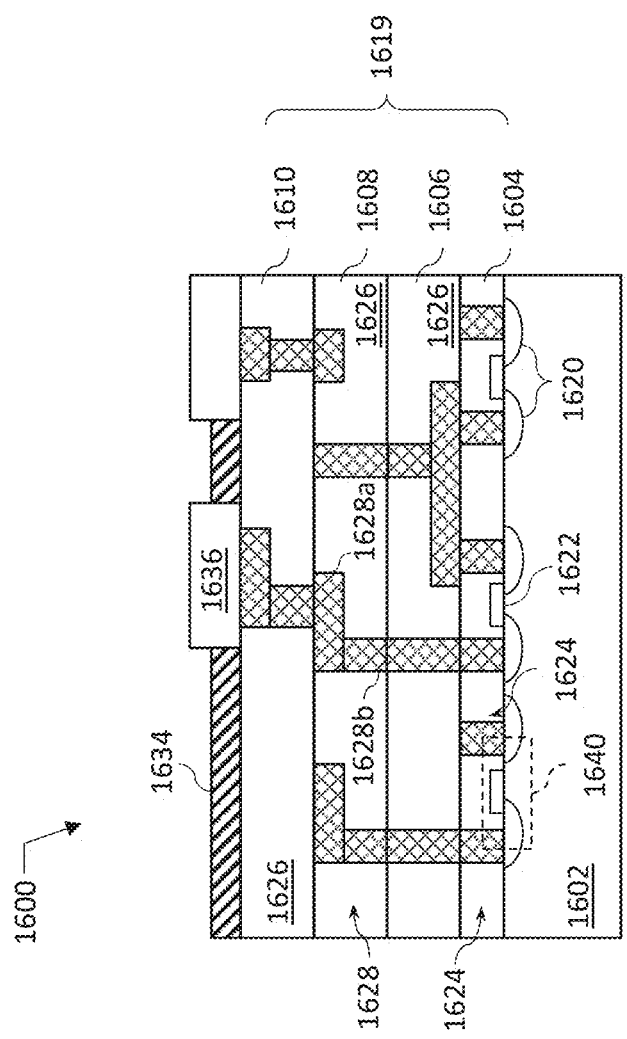
FIG. 10 is a cross-sectional side view of an IC device that may include interconnects with barrier material liners in accordance with any of the embodiments disclosed herein.

FIG. 10 is a cross-sectional side view of an IC device 1600 that may include one or more IC structures with one or more interconnects with barrier material liners in accordance with any of the embodiments disclosed herein. The IC device 1600 may be formed on a substrate 1602 (e.g., the wafer 1500 of FIG. 9A) and may be included in a die (e.g., the die 1502 of FIG. 9B). The substrate 1602 may be any substrate as described herein. The substrate 1602 may be part of a singulated die (e.g., the dies 1502 of FIG. 9B) or a wafer (e.g., the wafer 1500 of FIG. 9A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 10 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Although not specifically shown in FIG. 10, the IC device 1600 may include one or more interconnects with barrier material liners at any suitable location in the IC device 1600.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 10 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 10). Although a particular number of interconnect layers 1606-1610 is depicted in FIG. 10, embodiments of the present disclosure include IC devices having more or fewer interconnect layers than depicted.

In some embodiments, the interconnect structures 1628 may include trench contact structures 1628*a* (sometimes referred to as "lines") and/or via structures 1628*b* (sometimes referred to as "holes") filled with an electrically conductive material such as a metal. The trench contact structures 1628*a* may be arranged to route electrical signals in a direction of a plane that is substantially parallel with a surface of the substrate 1602 upon which the device layer 1604 is formed. For example, the trench contact structures 1628*a* may route electrical signals in a direction in and out of the page from the perspective of FIG. 10. The via structures 1628*b* may be arranged to route electrical signals in a direction of a plane that is substantially perpendicular to the surface of the substrate 1602 upon which the device layer 1604 is formed. In some embodiments, the via structures 1628*b* may electrically couple trench contact structures 1628*a* of different interconnect layers 1606-1610 together.

The interconnect layers 1606-1610 may include a dielectric material 1626 disposed between the interconnect structures 1628, as shown in FIG. 10. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures 1628*a* and/or via structures 1628*b*, as shown. The trench contact structures 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include via structures 1628*b* to couple the trench contact structures 1628*a* of the second interconnect layer 1608 with the trench contact structures 1628*a* of the first interconnect layer 1606. Although the trench contact structures 1628*a* and the via structures 1628*b* are structurally delineated with a line within each interconnect layer (e.g., within the second interconnect layer 1608) for the sake of clarity, the trench contact structures 1628*a* and the via structures 1628*b* may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 11:
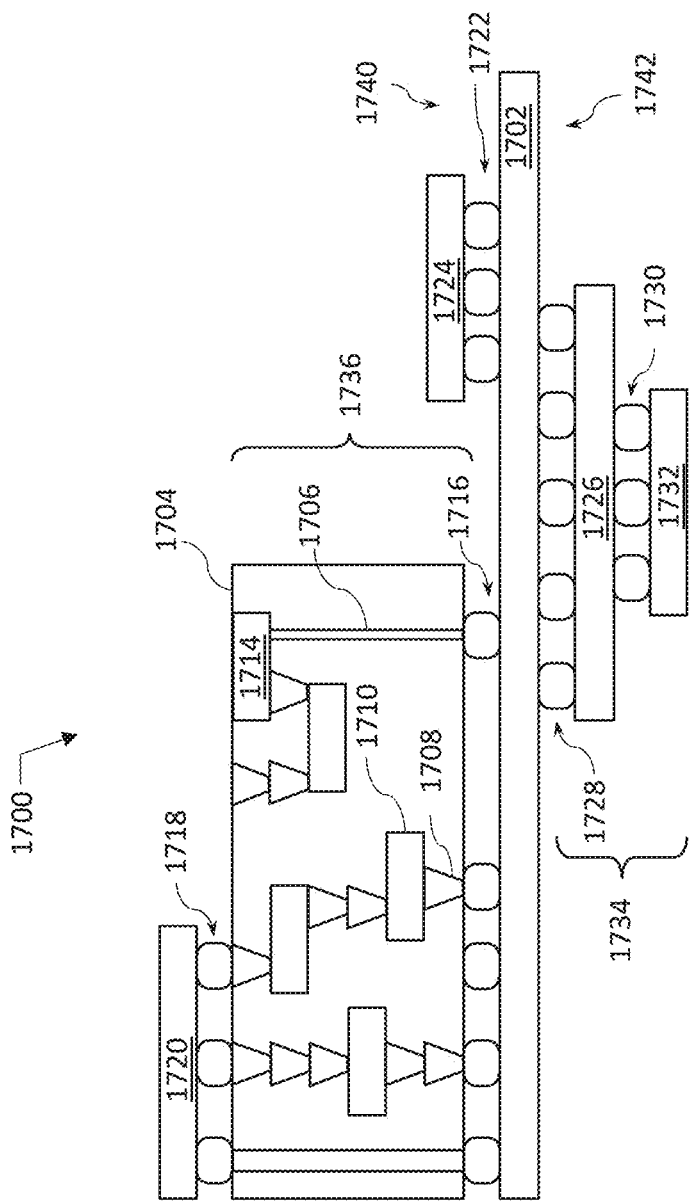
FIG. 11 is a cross-sectional side view of an IC device assembly that may include interconnects with barrier material liners in accordance with any of the embodiments disclosed herein.

FIG. 11 is a cross-sectional side view of an IC device assembly 1700 that may include components having or being associated with (e.g., being electrically connected by means of) one or more IC structures with interconnects with barrier material liners in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the interconnects with barrier material liners, disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 11 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 11), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 11, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 9B), an IC device (e.g., the IC device 1600 of FIG. 10), or any other suitable component. In some embodiments, the IC package 1720 may include interconnects with barrier material liners, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 11, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The interposer 1704 may further include interconnects with barrier material liners, as described herein. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 11 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 12:
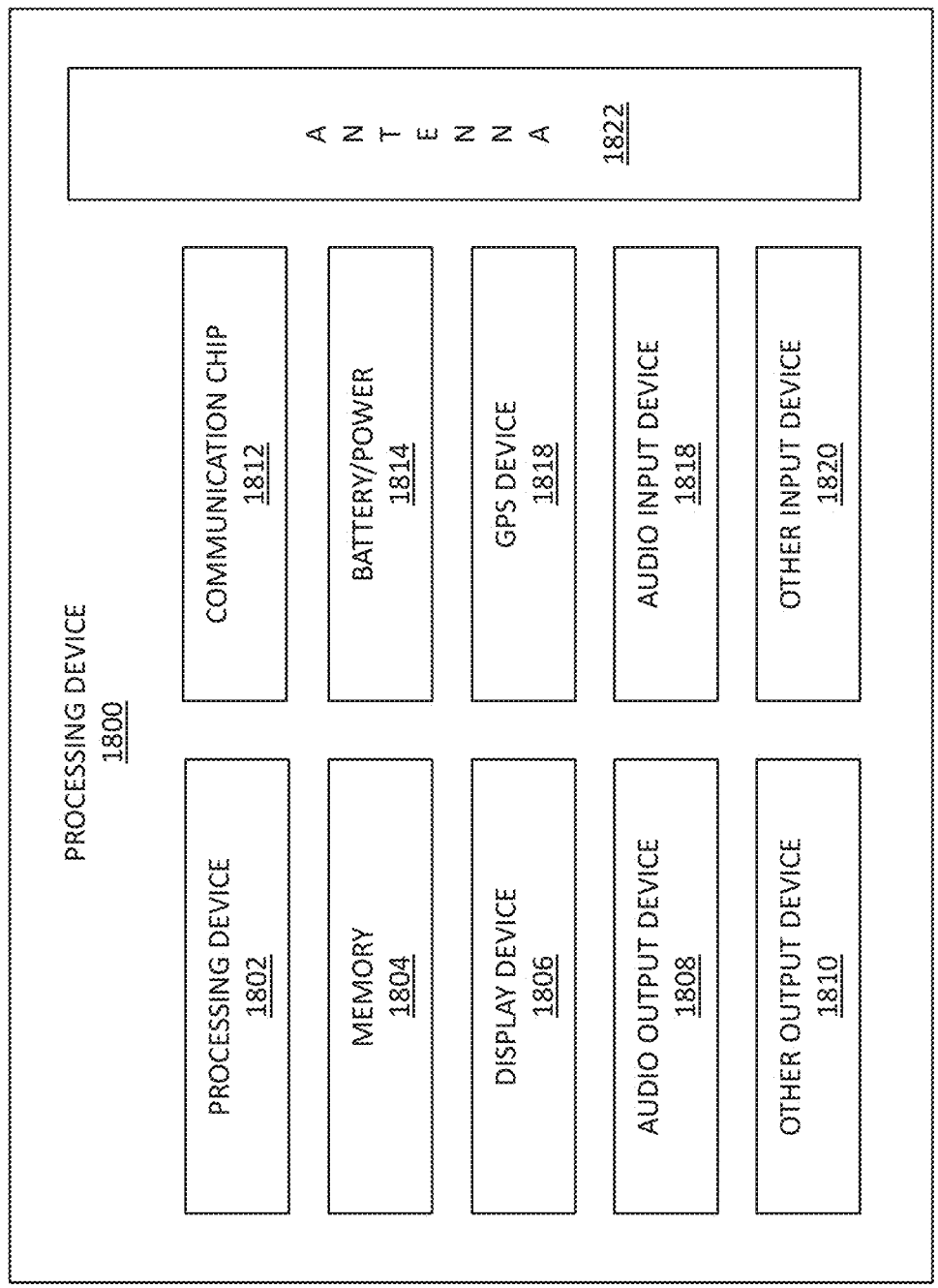
FIG. 12 is a block diagram of an example computing device that may include interconnects with barrier material liners in accordance with any of the embodiments disclosed herein.

FIG. 12 is a block diagram of an example computing device 1800 that may include one or more components including one or more IC structures with one or more interconnects with barrier material liners in accordance with any of the embodiments disclosed herein. For example, any suitable ones of the components of the computing device 1800 may include a die (e.g., the die 1502 of FIG. 9B)

having interconnects with barrier material liners as described herein. Any one or more of the components of the computing device 1800 may include, or be included in, an IC device 1600 (FIG. 10). Any one or more of the components of the computing device 1800 may include, or be included in, an IC device assembly 1700 (FIG. 11).

A number of components are illustrated in FIG. 12 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 12, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-M RAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides an IC device that includes a transistor including a channel material; an S/D contact coupled to the channel material; a metal interconnect electrically coupled to the S/D contact; and a liner between the S/D contact and the metal interconnect, the liner including tungsten.

Example 2 provides the IC device of claim 1, where the channel material includes a first S/D region and a second S/D region formed therein, the S/D contact coupled to the first S/D region.

Example 3 provides the IC device of claim 1 or 2, where the liner includes a first layer adjacent to the S/D contact and a second layer adjacent to the metal interconnect, where the first layer includes tungsten.

Example 4 provides the IC device of claim 3, where the second layer includes tantalum.

Example 5 provides the IC device of claim 3, where the second layer includes tantalum and nitrogen.

Example 6 provides the IC device of claim 3, where the liner further includes a third layer between the first layer and the second layer.

Example 7 provides the IC device of claim 6, where the second layer includes tantalum, and the third layer includes tantalum and nitrogen.

Example 8 provides the IC device of claim 6, where the second layer includes tantalum and nitrogen, and the third layer includes tantalum.

Example 9 provides the IC device of any of claims 1-8, where the channel material includes oxygen.

Example 10 provides the IC device of any of claims 1-9, where the channel material includes indium.

Example 11 provides the IC device of claim 9 or 10, where the channel material further includes zinc.

Example 12 provides the IC device of claim 11, where the channel material further includes gallium.

Example 13 provides the IC device of claim 1, where the channel material includes indium, gallium, zinc, and oxygen.

Example 14 provides the IC device of any of the preceding claims, where the liner has a thickness between 0.5 nanometers and 10 nanometers, e.g., between 1 nanometer and 5 nanometers.

Example 15 provides an IC device that includes a transistor having a channel material; a first S/D contact coupled to the channel material; a second S/D contact coupled to the channel material; a capacitor coupled to the second S/D contact; a metal interconnect electrically coupled to the first S/D contact; and a liner between the S/D contact and the metal interconnect, the liner including tungsten.

Example 16 provides the IC device of claim 15, further including a second metal interconnect is coupled between the second S/D contact and the capacitor; and a second liner between the second metal interconnect and the second S/D contact, the second liner including tungsten.

Example 17 provides the IC device of claim 15 or 16, where the liner includes a first layer adjacent to the S/D contact and a second layer adjacent to the metal interconnect, where the first layer includes tungsten.

Example 18 provides the IC device of claim 17, where the second layer includes tantalum.

Example 19 provides the IC device of claim 17, where the second layer includes tantalum and nitrogen.

Example 20 provides the IC device of any of claims 15-19, where the channel material includes indium, gallium, zinc, and oxygen.

Example 21 provides a method for fabricating an IC device, the method including forming at least one transistor over a support structure; depositing a dielectric material over the transistor; patterning an interconnect region in the dielectric material; depositing a liner in the interconnect region, the liner including tungsten; and depositing an interconnect in the interconnect region and over the liner.

Example 22 provides the method of claim 21, further including forming a capacitor coupled to the interconnect, the transistor and the capacitor forming a memory cell.

Example 23 provides the method of either of claims 21 and 22, where depositing the liner involves depositing a first liner layer including tungsten; and depositing a second liner layer including tantalum.

Example 24 provides an IC device that includes a transistor including a channel material; an S/D contact coupled to the channel material; a metal interconnect electrically coupled to the S/D contact; and a liner between the S/D contact and the metal interconnect, the liner including tungsten.

Example 25 provides the IC device of claim 24, where the channel material includes a first S/D region and a second S/D region formed therein, the S/D contact coupled to the first S/D region.

Example 26 provides the IC device of claim 24 or 25, where the liner includes a first layer adjacent to the S/D contact and a second layer adjacent to the metal interconnect, where the first layer includes tungsten.

Example 27 provides the IC device of claim 26, where the second layer includes tantalum.

Example 28 provides the IC device of claim 26, where the second layer includes tantalum and nitrogen.

Example 29 provides the IC device of claim 26, where the liner further includes a third layer between the first layer and the second layer.

Example 30 provides the IC device of claim 29, where the second layer includes tantalum, and the third layer includes tantalum and nitrogen.

Example 31 provides the IC device of claim 29, where the second layer includes tantalum and nitrogen, and the third layer includes tantalum.

Example 32 provides the IC device of any of claims 24-31, where the channel material includes oxygen.

Example 33 provides the IC device of any of claims 24-32, where the channel material includes indium.

Example 34 provides the IC device of claim 32 or 33, where the channel material further includes zinc.

Example 35 provides the IC device of claim 34, where the channel material further includes gallium.

Example 36 provides the IC device of claim 24, where the channel material includes indium, gallium, zinc, and oxygen.

Example 37 provides the IC device of any of the preceding claims, where the liner has a thickness between 0.5 nanometers and 10 nanometers, e.g., between 1 nanometer and 5 nanometers.

Example 38 provides an IC device that includes a transistor having a channel material; a first S/D contact coupled to the channel material; a second S/D contact coupled to the channel material; a capacitor coupled to the second S/D contact; a metal interconnect electrically coupled to the first S/D contact; and a liner between the S/D contact and the metal interconnect, the liner including tungsten.

Example 39 provides the IC device of claim 38, further including a second metal interconnect is coupled between the second S/D contact and the capacitor; and a second liner between the second metal interconnect and the second S/D contact, the second liner including tungsten.

Example 40 provides the IC device of claim 38 or 39, where the liner includes a first layer adjacent to the S/D contact and a second layer adjacent to the metal interconnect, where the first layer includes tungsten.

Example 41 provides the IC device of claim 40, where the second layer includes tantalum.

Example 42 provides the IC device of claim 40, where the second layer includes tantalum and nitrogen.

Example 43 provides the IC device of any of claims 38-42, where the channel material includes indium, gallium, zinc, and oxygen.

Example 44 provides a method for fabricating an IC device, the method including forming at least one transistor over a support structure; depositing a dielectric material over the transistor; patterning an interconnect region in the dielectric material; depositing a liner in the interconnect region, the liner including tungsten; and depositing an interconnect in the interconnect region and over the liner.

Example 45 provides the method of claim 44, further including forming a capacitor coupled to the interconnect, the transistor and the capacitor forming a memory cell.

Example 46 provides the method of either of claim 44 or 45, where depositing the liner involves depositing a first liner layer including tungsten; and depositing a second liner layer including tantalum.

Example 47 provides an IC package that includes an IC die, including one or more of the IC devices according to any one of the preceding examples. The IC package may also include a further component, coupled to the IC die.

Example 48 provides the IC package according to example 47, where the further component is one of a package substrate, a flexible substrate, or an interposer.

Example 49 provides the IC package according to examples 47 or 48, where the further component is coupled to the IC die via one or more first level interconnects.

Example 50 provides the IC package according to example 49, where the one or more first level interconnects include one or more solder bumps, solder posts, or bond wires.

Example 51 provides a computing device that includes a circuit board; and an IC die coupled to the circuit board, where the IC die includes one or more of the memory/IC devices according to any one of the preceding examples (e.g., memory/IC devices according to any one of examples 1-46), and/or the IC die is included in the IC package according to any one of the preceding examples (e.g., the IC package according to any one of examples 47-50).

Example 52 provides the computing device according to example 51, where the computing device is a wearable computing device (e.g., a smart watch) or hand-held computing device (e.g., a mobile phone).

Example 53 provides the computing device according to examples 51 or 52, where the computing device is a server processor.

Example 54 provides the computing device according to examples 51 or 52, where the computing device is a motherboard.

Example 55 provides the computing device according to any one of examples 51-54, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device comprising:
  a transistor comprising a channel material;
  a source or drain (S/D) contact coupled to the channel material;
  a metal interconnect electrically coupled to the S/D contact; and
  a liner between the S/D contact and the metal interconnect, the liner comprising:
    a first layer comprising tungsten;
    a second layer between the first layer and the metal interconnect, wherein the first layer is between the second layer and the S/D contact; and
    a third layer between the first layer and the second layer, wherein the second layer comprises tantalum, the third layer comprises tantalum, and one of the second layer and the third layer further comprises nitrogen.

2. The IC device of claim 1, wherein the channel material comprises a first S/D region and a second S/D region formed therein, the S/D contact coupled to the first S/D region.

3. The IC device of claim 1, wherein the first layer is in contact with the S/D contact and the second layer, and the second layer is not in contact with the S/D contact.

4. The IC device of claim 1, wherein the second layer comprises tantalum.

5. The IC device of claim 1, wherein the second layer comprises tantalum and nitrogen.

6. The IC device of claim 1, wherein the third layer comprises tantalum and nitrogen.

7. The IC device of claim 1, wherein the second layer comprises tantalum and nitrogen.

8. The IC device of claim 1, wherein the channel material comprises oxygen.

9. The IC device of claim 8, wherein the channel material comprises indium.

10. The IC device of claim 8, wherein the channel material further comprises zinc.

11. The IC device of claim 8, wherein the channel material further comprises gallium.

12. The IC device of claim 1, wherein the channel material comprises indium, gallium, zinc, and oxygen.

13. The IC device of claim 1, wherein the liner has a thickness between 0.5 nanometers and 10 nanometers.

14. An integrated circuit (IC) device comprising:
a transistor comprising a channel material;
a first source or drain (S/D) contact coupled to the channel material;
a second S/D contact coupled to the channel material;
a capacitor coupled to the second S/D contact;
a metal interconnect electrically coupled to the first S/D contact; and
a liner between the first S/D contact and the metal interconnect, the liner comprising a first layer, a second layer, and a third layer between the first layer and the second layer, the first layer comprising tungsten, the second layer and the third layer comprising tantalum, one of the second layer and the third layer comprising nitrogen, and the first layer between the third layer and the first S/D contact.

15. The IC device of claim 14, further comprising:
a second metal interconnect is coupled between the second S/D contact and the capacitor; and
a second liner between the second metal interconnect and the second S/D contact, the second liner comprising tungsten.

16. The IC device of claim 14, wherein the first layer is adjacent to the S/D contact and the second layer is adjacent to the metal interconnect.

17. The IC device of claim 14, wherein the channel material comprises indium, gallium, zinc, and oxygen.

18. The IC device of claim 14, wherein the second liner layer comprises nitrogen, and the third liner layer does not comprise nitrogen.

19. The IC device of claim 14, wherein the second liner layer does not comprise nitrogen, and the third liner layer comprises nitrogen.

20. A method for fabricating an integrated circuit (IC) device, the method comprising:
forming at least one transistor over a support structure;
depositing a dielectric material over the transistor;
patterning an interconnect region in the dielectric material;
depositing a first liner layer in the interconnect region, the first liner layer comprising tungsten;
depositing a second liner layer over the first liner layer, the second liner layer comprising tantalum;
depositing a third liner layer over the second liner layer, the third liner layer comprising tantalum, and one of the second liner layer and the third liner layer comprising nitrogen; and
depositing an interconnect in the interconnect region and over the second liner layer.

* * * * *